United States Patent [19]

Suzuki et al.

[11] 4,268,761

[45] May 19, 1981

[54] INTERFACE CIRCUIT FOR CONVERTING LOGIC SIGNAL LEVELS

[75] Inventors: Yasoji Suzuki, Ayase; Tetsuya Iida, Yokohama, both of Japan

[73] Assignee: Tokyo Shibaura Denki Kabushiki Kaisha, Kawasaki, Japan

[21] Appl. No.: 16,565

[22] Filed: Mar. 1, 1979

[30] Foreign Application Priority Data

Mar. 1, 1978 [JP] Japan .................................. 53-22999

[51] Int. Cl.³ .......................................... H03L 5/00
[52] U.S. Cl. .............................. 307/264; 307/DIG. 1
[58] Field of Search ......................... 307/DIG. 1, 264

[56] References Cited

U.S. PATENT DOCUMENTS

| | | | |
|---|---|---|---|
| 3,622,902 | 11/1971 | Thomas | 330/253 |
| 3,900,746 | 8/1975 | Kraft et al. | 307/DIG. 1 |
| 4,031,409 | 6/1977 | Shimada et al. | 307/DIG. 1 |
| 4,147,940 | 4/1979 | Beydler et al. | 307/DIG. 1 |

OTHER PUBLICATIONS

"Interface Circuits Drive . . . Low Level Inputs", by Jenkins Electronic Engineering, May 1971, pp. 45–49.

Primary Examiner—Harold A. Dixon
Attorney, Agent, or Firm—Oblon, Fisher, Spivak, McClelland & Maier

[57] ABSTRACT

An input terminal of an interface circuit is connected to a first logic circuit which produces a first logic signal. The interface circuit compares the first logic signal with a reference voltage whose level is set between a high level and a low level of the first logic signal. The interface circuit converts levels of the signal compared. An output terminal of the interface circuit is connected to a second logic circuit whose signal levels are different from levels of the first logic signal and which is driven by the output signal compared and amplified.

6 Claims, 7 Drawing Figures

INTERFACE CIRCUIT FOR CONVERTING LOGIC SIGNAL LEVELS

BACKGROUND OF THE INVENTION

This invention relates to an interface circuit for converting logic signal levels.

Generally, a power supply of about +5 V is connected to logic circuits constructed from bipolar transistors, for example a transistor-transistor-logic (hereinafter called a TTL) circuit. The high level of the TTL circuit output ranges from about 5 V to 2.4 V and the low level ranges from about 0.8 V to 0 V. Therefore, in the worst case for distinguishing the output levels, the high level of the TTL circuit output is 2.4 V and the low level is 0.8 V. On the other hand, a logic circuit constructed from MOSFETs (metal-oxide-semiconductor field-effect transistor) (hereinafter called a MOS-logic-circuit) is generally driven by a power supply, for example, of about +10 V, different from that of a TTL circuit. In this MOS-logic-circuit, the boundary between a high level and a low level is about +5 V. So in the worst case, the high level of the TTL almost coincides with the low level of the MOS-logic-circuit and the signal of the TTL circuit cannot drive the MOS-logic-circuit directly. Therefore it is necessary to insert an interface circuit to raise the output levels of the TTL circuit up to a sufficiently high level to drive the MOS-logic-circuit correctly. And, when using the same power supply, it is necessary to insert an interface circuit in order to drive all MOSFETs correctly. It is difficult to manufacture many circuits which have a uniform circuit threshold voltage for the reason that it is difficult to manufacture many MOSFETs having a uniform threshold voltage. So, in the case of manufacturing the MOS-logic circuit driven by the TTL signal, the levels of the TTL-output-signal must be raised by connecting the output terminal of the TTL circuit through a resistor to the power supply of the MOS-logic-circuit. In this way, the voltage level of the connecting point of the resistor is at the power supply potential or ground potential.

But, generally this method is expensive because the resistor is provided outside the ICs (integrated circuits) which are used in the MOS-logic-circuit and TTL circuit. There is a way to construct a resistor on an IC together with the MOS-logic-circuit. But, in case the TTL-signal drives many MOS-logic-circuits, the output signal levels of the TTL circuit often change according to the number of resistors which are connected in parallel with the output terminal of the TTL. As a result, the circuit often causes miss action and it is difficult to drive the MOS-logic-circuit properly.

SUMMARY OF THE INVENTION

Accordingly, an object of the invention is to provide an interface circuit for correctly transmitting a logic signal from one logic circuit to another logic circuit where the levels of the two logic circuits differ.

Another object of the invention is to provide an interface circuit for converting voltage levels of a TTL output signal to levels of a MOS-logic-circuit when the TTL-signal is used to drive many MOS-logic-circuits.

Another object of the invention is to provide an interface circuit for correctly transmitting a logic signal between a logic circuit constructed from bipolar elements and a logic-circuit constructed from MOS elements.

According to the invention, there is provided an interface circuit comprising an input terminal connected to a first logic circuit producing a first logic signal, means for producing an intermediate reference voltage between a high level and a low level of the logic signal, means for comparing the first logic signal with the intermediate reference voltage and producing a second logic signal which has levels different from the first logic signal, and an output terminal connected to a second logic circuit producing a third logic signal which has levels different from the first logic signal.

BRIEF DESCRIPTION OF THE DRAWINGS

Various other objects, features and attendant advantages of the present invention will be more fully appreciated as the same becomes better understood from the following detailed description when considered in connection with the accompanying drawings in which like reference characters designate like or corresponding parts throughout the several views, and wherein:

FIG. 6 shows a circuit diagram of a fifth embodiment of the invention; and

FIG. 7 shows a circuit diagram of a sixth embodiment of the invention.

DETAILED DESCRIPTION OF THE PREFERRED EMBODIMENTS

Figure 1:
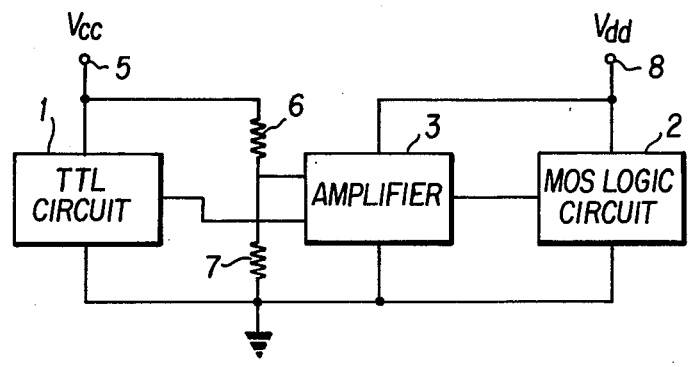
FIG. 1 shows a block diagram of a first embodiment of the invention.

Reference is first made to FIG. 1 illustrating a first embodiment of the invention. In this Figure, an interface circuit, that is an amplifier 3 which compares levels and amplifies levels, is inserted between a TTL circuit 1 and a MOS logic-circuit 2. A first power supply Vcc (about +5 V) is connected to the TTL circuit at a terminal 5. An output terminal of the TTL circuit 1 is connected to an input terminal of the amplifier 3, and an output terminal of the amplifier 3 is connected to an input terminal of the MOS-logic-circuit 2. An output signal of the TTL circuit 1 and a reference voltage whose magnitude is between the high level and the low level of the signal produced by the TTL circuit 1 are applied to the input terminals of the amplifier 3. The reference voltage is produced by dividing the potential of the first power supply in half by two resistors 6 and 7. The amplifier 3 compares the output signal of the TTL circuit 1 with the reference voltage Vref (about 1.7 V) and amplifies the compared signal up to the level of a second power supply Vdd (about +10 V) whose magnitude is higher than the voltage level of the first power supply. The output signal of the amplifier 3 has higher logic level than the logic level of the TTL circuit 1. The amplifier 3 raises the signal level up to a voltage level at which the signal can drive the MOS-logic-circuit 2 so that the output signal of the amplifier 3 correctly drives the MOS-logic-circuit 2.

A first embodiment of the invention has two different power supplies, but it is possible to operate the circuits from a single power supply. Even if the TTL circuit 1 and the MOS-logic-circuit 2 are operated from one power supply, it is necessary to insert the amplifier 3 in order to correctly drive the MOS-logic-circuit 2. Because it is difficult to manufacture many MOSFETs having a uniform threshold voltage, it is difficult to manufacture many circuits which have a uniform circuit threshold voltage.

This invention is also applicable to an interface circuit between a plurality of MOS-logic-circuits which have different logic-signal-levels.

In the first embodiment, the signal of a single TTL circuit drives a single MOS-logic-circuit. It will be understood, however, that this is to be interpreted as exemplary rather than limiting, and for example the signal of one TTL can correctly drive a plurality of MOS-logic-circuits. In the latter case, maximum benefit of this invention can be obtained.

Figure 2:
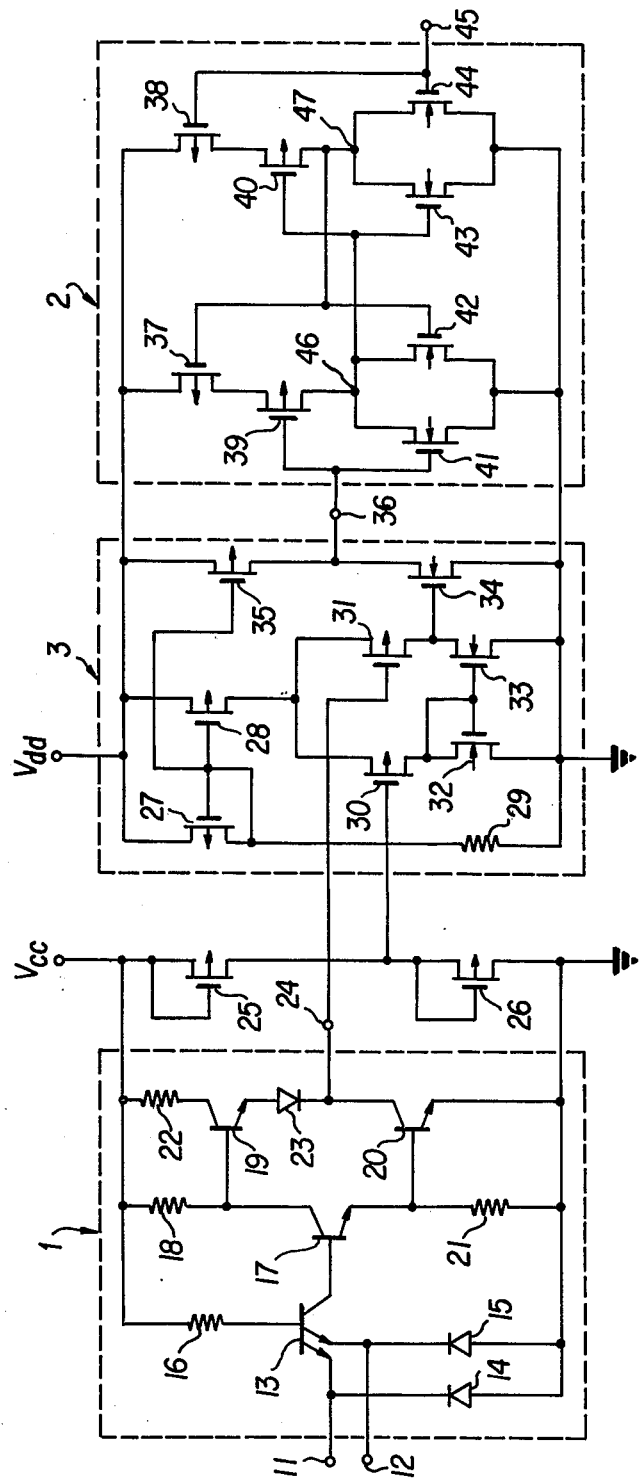
FIG. 2 shows a circuit diagram of a second embodiment of the invention.

FIG. 2 shows a circuit diagram of a second embodiment of this invention. In this embodiment, input terminals 11 and 12 of the TTL circuit are respectively connected to an emitter of an input transistor 13 and to ground through diodes 14 and 15. The base of the input transistor 13 is connected to the first power supply Vcc through a resistor 16, and the collector is connected to the base of a transistor 17. A collector of the transistor 17 is connected to the first power supply Vcc through a resistor 18 and to a base of a transistor 19. The emitter of the transistor 17 is connected to the base of transistor 20 and to ground through a resistor 21. The collector of the transistor 19 is connected to the first power supply Vcc and the emitter is connected to the anode of a diode 23. The cathode of the diode 23 is connected to an output terminal 24 of the TTL circuit 1 and to the collector of the transistor 20. The emitter of the transistor 20 is directly connected to ground.

Two P-channel depletion MOSFETs 25 and 26 whose gates are connected to their sources are connected in series between the first power supply Vcc and ground. The two MOSFETs 25 and 26 operate as resistor elements which have a predetermined value of resistance. These MOSFETs 25 and 26 constitute a circuit for producing an intermediate reference voltage Vref whose magnitude is fixed at an intermediate voltage between the high level and the low level of the output signal of the TTL circuit 1.

The output signal of the TTL circuit 1 and the reference voltage Vref are compared with each other and the difference between the two compared voltages is amplified to produce an output signal and the output signal correctly drives the MOS-logic-circuit 2.

The sources of the P-channel MOSFETs 27 and 28 are connected in parallel to the second power supply Vdd which operates the amplifier 3. The voltage level of the second power supply Vdd is higher than the first power supply Vcc, so the logic signal levels of the MOS-logic-circuit 2 are higher than logic-signal levels of the TTL 1. The gates of the MOSFETs 27 and 28 are connected in common to the drain of the MOSFETs 27 and to ground through a resistor 29. That is, the two MOSFETs 27 and 28 and the resistor 29 constitute a constant current circuit which produces a constant current flow from the drain of the MOSFETs 28. The drain of the MOSFET 28 is connected to the sources of the P-channel MOSFETs 30 and 31. The reference voltage Vref is applied to the gate of the MOSFET (30), and the output logic signal $V_1$ of the TTL circuit 1 is applied to the gate of the MOSFET 31. The drains of the two MOSFETs 30 and 31 are respectively connected to the drains of a pair of N-channel MOSFETs 32 and 33 whose gates and sources are connected in common. A common node of the gates of the MOSFETs 32 and 33 is connected to the drain of the MOSFET 32, and a common node of the sources of the MOSFETs 32 and 33 is connected to ground point. Thus, the MOSFETs 30, 31, 32 and 33 constitute a differential amplifier circuit whose loads are the MOSFETs 32 and 33. The circuit compares the output signal $V_1$ with the reference voltage Vref respectively applied to the gates of the MOSFETs 30 and 31. A connecting point of the MOSFETs 31 and 32 is connected to the gate of an N-channel MOSFET 34. The difference $V_2$ between the two compared voltages is output by the differential amplifier, and inverted and amplified by a linear amplifier which is constituted by the MOSFET 34 and P-channel MOSFET 35, and the output signal of the linear amplifier is provided to an output terminal 36. Namely, the amplifier 3 is constructed from a constant current circuit, a differential amplifier and a linear amplifier.

The output signal $V_2$ is provided to a MOS-logic-circuit 2 which has a logic function of a flip-flop circuit and is constructed from complimentary MOSFETs. The sources of P-channel MOSFETs 37 and 38 are connected to the second power supply Vdd. The drain of the MOSFET 37 is connected to the source of a P-channel MOSFET 39 whose gate is connected to the output terminal 36 of the amplifier 3. The drain of the MOSFET 38 is connected to the source of a P-channel MOSFET 40 whose gate is connected to the drain of the MOSFET 39. The source of the MOSFET 39 is connected to the drains of N-channel MOSFETs 41 and 42 which are connected in parallel. The gate of the MOSFET 41 is connected to the output terminal 36 and the source of the MOSFET 41 is connected to ground. The gate of the MOSFET 42 is connected to the gate of the MOSFET 37, and the source of the MOSFET 42 is connected to ground. The drain of the MOSFET 40 is connected to the drains of N-channel MOSFETs 43 and 44 which are connected in parallel and to the gates of the MOSFETs 37 and 42. The sources of the MOSFETs 43 and 44 are connected in common to ground. The gates of the MOSFETs 43 and 40 are connected to the drains of the MOSFETs 41 and 42. The gates of the MOSFETs 38 and 44 are connected to the other input terminal 45 of the flip-flop circuit.

The input signals of this flip-flop circuit are supplied from the output terminal 36 of the amplifier 3 and the input terminal 45. The output signal corresponding to the input signals is obtained at nodes 46 and 47. If the level of the input signal applied to the output terminal 36 is high and the level of the input signal applied to the input terminal 45 is low, the output signal level of the node 46 becomes low and the node 47 becomes high. If the level of the input signal is inverted, the output signal level of the two nodes 46 and 47 will be inverted also.

Figure 3:
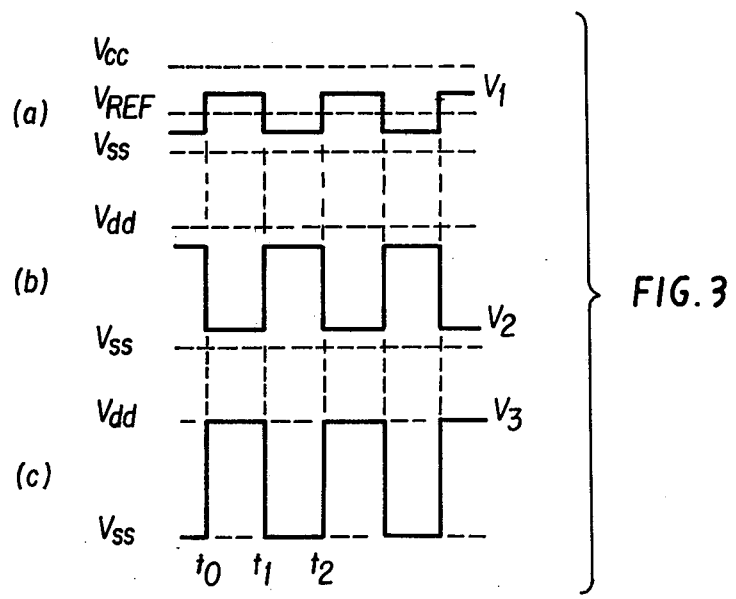
FIG. 3 shows waveforms for illustrating the operation of the FIG. 2 circuit.

The operation of the circuit shown in FIG. 2 will now be described. An input signal is applied at the input terminals 11 and 12 to the emitters of the transistor 13 which has a logical OR function. The output signal is applied to the base of the transistor 17. The transistor 17 transmits a signal according to the output signal from the transistor 13 to the bases of the transistors 19 and 20. An output signal $V_1$ of the TTL circuit 1 according to the signal from the transistors 19 and 20 is obtained at the output terminal 24 of the TTL circuit 1. This output signal $V_1$ is shown in FIG. 3a. When the output signal level $V_1$ of the TTL circuit 1 applied to the gate of the MOSFET 31 is higher than the reference voltage Vref applied to the gate of the MOSFET 30, namely in the interval between $t_0$ and $t_1$ in FIG. 3, the drain current of the MOSFET 31 decreases because the MOSFET 31 becomes less conductive and the drain current of the MOSFET 30 increases because the MOSFET 30 becomes more conductive. Therefore, the level of the output signal V2 of the differential amplifier becomes low. The output signal of the differential amplifier is inverted and amplified by the linear amplifier, so that the level of the output signal V3 of the amplifier 3 has the level of the second power supply Vdd. Next, when the output signal $V_1$ is higher than the reference voltage Vref, namely in the interval between $t_1$ and $t_2$ in FIG. 3, the drain current of the MOSFET 31 is greater than the current of the MOSFET 30. Therefore, the level of the output signal V2 of the differential amplifier becomes high. Now, the value of resistance of the MOSFET 33 is predetermined. If the potential difference in the case where the drain current flows more than said case is higher than the threshold level of input level which the output signal of the MOSFET 34 can be inverted, the output signal V2 of the differential amplifier is inverted and amplified by the linear amplifier. So the level of the output signal V3 of the amplifier 3 becomes the level of ground potential. Thus, according to this circuit as the output signal V1 of the TTL circuit 1 is applied to the gate of the MOSFET 31 which constitutes the input section of the differential amplifier, very little output current flows from the TTL circuit 1. So the levels of the output signal $V_1$ of the TTL circuit 1 are always kept constant.

Further it is preferable that the width of the gate of the MOSFET 34 which constitutes the linear amplifier be twice as long as that of the MOSFET 33. Then the amplification degree of the linear amplifier is largest, and the linear amplifier operates most stably. The reason is as follows. Now, it is assumed that the signal $V_1$ and the reference voltage Vref are equal. Then, if the drain current of the MOSFET 28 is I, the drain current of the MOSFET 33 is I/2. And, as the gate of MOSFET 35 is of the same size as that of the MOSFET 28, the drain current of the MOSFETs 34 and 35 is I. So, the direct current (DC) which is applied to the gate of the MOSFET 34 has the same level as the DC level of the drain side of the MOSFET 33 because the width of the gate of the MOSFET 34 is twice as long as that of the MOSFET 33. Then, as the value of resistance of the MOSFET 33 is predetermined so that the DC level of the output of the differential amplifier is a half of the first power supply Vdd, the standard point at which the linear amplifier inverts the input signal is the point of Vdd/2. So, the amplification degree of the linear amplifier becomes largest and the linear amplifier operates stably. Generally, it is natural that the two input signals of the differential amplifier are not the same in actual practice and the linear amplifier inverts and amplifies the signal to the upper or lower side of the standard point of the linear amplifier.

Next, the output signal of the linear amplifier, namely the output signal of the amplifier 3, is transmitted to the MOS-logic-circuit 2. According to this transmitted signal and the signal applied to the other input terminal 45 of the flip-flop circuit, the output signal of the MOS-logic-circuit 2 is obtained at the output terminals 43 and 44.

Thus, by inserting the amplifier 3 as an interface circuit between the TTL circuit 1 and the MOS-logic-circuit 2, the signal levels of the TTL circuit are correctly converted to the signal levels of the MOS-logic-circuit 2. So the signal of the TTL 1 is correctly transmitted to the MOS-logic-circuit 2. It is natural that this circuit can be constructed from individual discrete elements, but generally the amplifier 3 and MOS-logic-circuit 2 are constructed on one semiconductor chip. In this way, the reliablity of the circuit is improved and the cost to manufacture goes down and, by constructing the circuit which produces the reference voltage Vref separately from the MOS-logic-circuit 2 and by applying the reference voltage Vref to the MOS-logic-circuit 2, this circuit can be applied to various TTL circuits and other logic circuits having various signal levels.

The resistor 29 in FIG. 2 can be replaced by a MOSFET, and the MOSFETs 32 and 33 can be replaced by registers.

Figure 4:
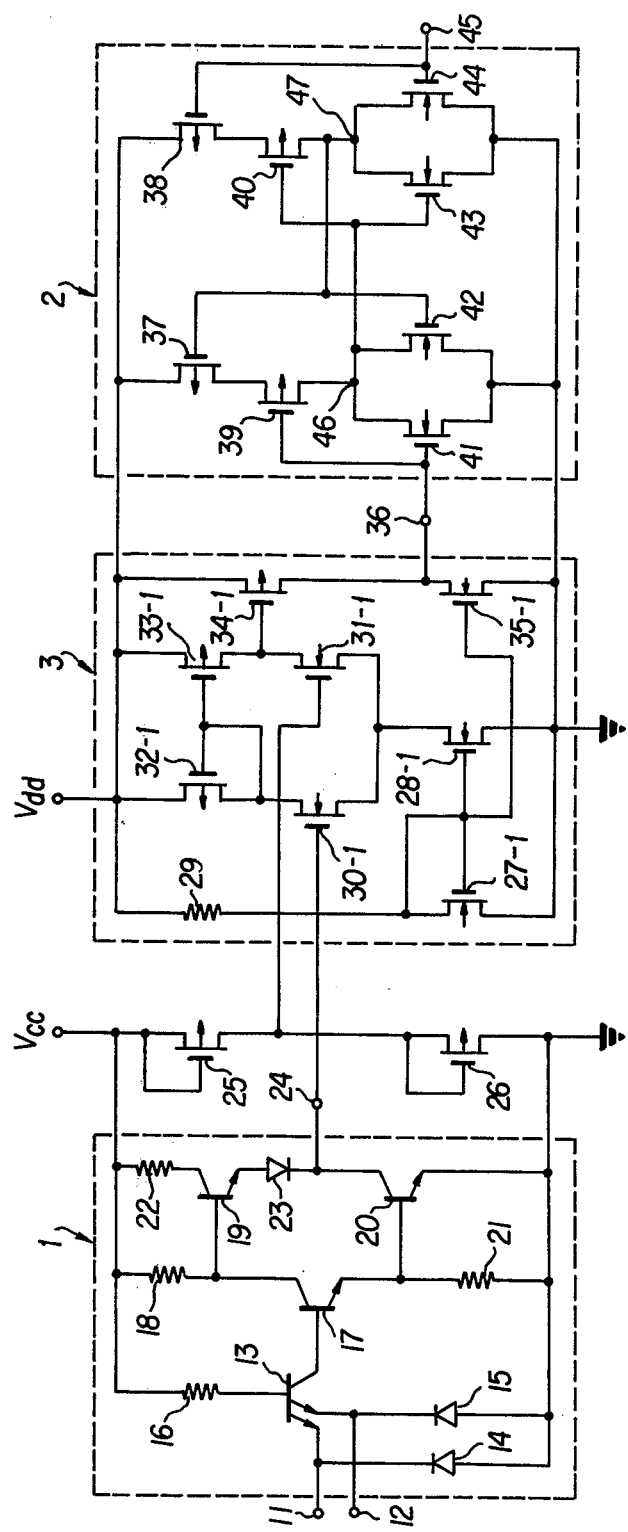
FIG. 4 shows a circuit diagram of a third embodiment of the invention.

Another embodiment of this invention is shown in FIG. 4. The amplifier 3 in this embodiment is constructed from MOSFETs whose channel type differs from the MOSFETs of the embodiment shown in FIG. 2. The elements corresponding to the elements shown in FIG. 2 are indicated by the same number and further, the MOSFETs which have different channel type from the MOSFETs shown in FIG. 2 have as suffix a numeral "1". An input signal which has opposite polarity to the input signal of the circuit shown in FIG. 2 is applied to the amplifier 3 so that this circuit has the same logic function as the circuit shown in FIG. 2. As the operation of this circuit is nearly the same as the circuit shown in FIG. 2, the description is omitted. In this embodiment the input MOSFETs of the differential amplifier are changed from P-channel MOSFETs to N-channel MOSFETs and the load MOSFETs are allowed to approach the second power supply Vdd. As the DC level of the input signal of the differential amplifier, which is equal to the reference voltage, is much lower than half of the first power supply Vcc, the MOSFETs 30-1 and 31-1 whose channel type is N-channel are operated in the saturation region more stably than the case where the input MOSFETs of the differential amplifier are P-channel MOSFETs.

Figure 5:
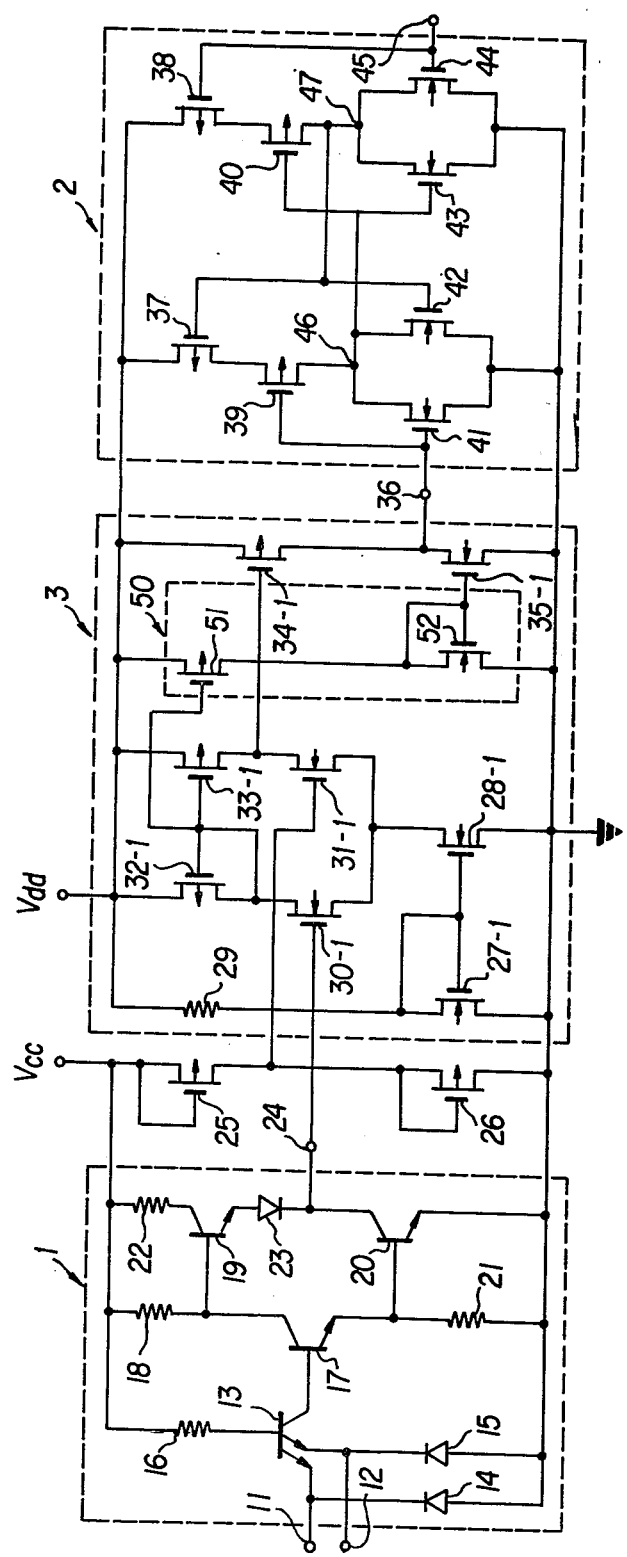
FIG. 5 shows a circuit diagram of a fourth embodiment of the invention.

Another embodiment of this invention is shown in FIG. 5. In this circuit, the stabilizing circuit 50 makes the linear amplifier operate correctly and stably. The stabilizing circuit 50 is constructed from a P-channel MOSFET 51 and a N-channel MOSFET 52. The source of the MOSFET 51 is connected to the second power supply Vdd and its gate is connected to the gates of the MOSFETs 32-1 and 33-1. The source of the MOSFET 52 is connected to ground and its drain is connected to the drain of the MOSFET 51 and its gate and the gate of the MOSFET 35-1.

When the two input DC levels of the amplifier 3 are the same, the circuit is previously designed so that the output DC level of the differential amplifier become Vdd/2. But, if the level of the first power supply Vcc were changed higher or lower from the fixed Vcc by some influence the output DC level of the differential amplifier would not become Vdd/2 and be changed according to the change. In this case, the standard point of the linear amplifier will be changed from Vdd/2 and the amplification degree will be changed. So the circuit will not usually operate stably. In the circuit shown in FIG. 5, the standard point of the linear amplifier is not changed when the first power supply Vcc is changed also.

The reason is given as follows. Now, when the first power supply Vcc becomes higher and the DC level of the two input signals applied to the amplifier 3 are the same, the MOSFETs 30-1 and 31-1 become more conductive, and potential difference between the source and the drain of the MOSFETs 30-1 and 31-1 respectively becomes lower. So, the DC level of the signal applied to the gate of the MOSFET 34-1 becomes lower, and the MOSFET 34-1 becomes more conductive. This will make the level of the drain side of the MOSFET 34-1 lower. But, as the DC level of the signal applied to the gate of the MOSFET 51, namely the output signal level of the drain side of the MOSFET 32-1, becomes lower for this reason, the MOSFET 51 becomes more conductive too. This will make the signal level applied to the gate of the MOSFET 35-1 higher. So the MOSFET 35-1 becomes more conductive. Namely, the MOSFET 34-1 and the MOSFET 35-1 simultaneously become more conductive according to the rise of the level of the first power supply Vcc. So, the standard point of the linear amplifier is usually fixed and the linear amplifier usually operates stably. It is natural that the circuit operates stably when the level of the first power supply became lower also.

Thus, according to this invention the signal of a TTL circuit can correctly drive a MOS-logic-circuit which has levels different from the signal levels of the TTL circuit.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An interface circuit comprising:
    an input terminal for supplying a first logic signal from a first logic circuit producing said first logic signal;
    means for producing an intermediate reference voltage between a high level and a low level of said first logic signal;
    means for comparing said first logic signal with said intermediate reference voltage to produce a second logic signal which has levels different from said first logic signal;
    an output terminal for outputting the second logic signal to a second logic circuit producing a third logic signal which has levels different from said first logic signal, and
    wherein said means for comparing includes a comparator for comparing said first logic signal with said reference voltage and a linear amplifier comprising a first MOSFET whose gate is connected to the output terminal of said comparator and a second MOSFET whose channel type is a channel type different from that of said first MOSFET and which is connected to said first MOSFET in series for amplifying the output signal from said comparator and producing said second logic signal.

2. An interface circuit comprising:
    an input terminal for supplying a first logic signal from a first logic circuit constructed of bipolar transistors, said first logic circuit producing said first logic signal;
    means for producing a reference voltage between a high level and a low level of said first logic signal;
    means for comparing said first logic signal with said reference voltage to produce a second logic signal which has higher levels than said first logic signal;
    an output terminal for outputting the second logic signal to a second logic circuit constructed of MOSFETs (Metal oxide semiconductor field effect transistors) said second logic circuit producing a third logic signal which has higher levels than said first logic signal, and
    wherein said means for comparing includes a comparator for comparing said first logic signal with said reference voltage and a linear amplifier comprising first MOSFET whose gate is connected to the output terminal of said comparator and a second MOSFET whose channel type is a channel type different from that of said first MOSFET and which is connected to said first MOSFET in series for amplifying the output signal from said comparator and producing said second logic signal.

3. An interface circuit comprising:
    an input terminal for supplying a first logic signal from a first logic circuit which produces said first logic signal and is operated by a first power supply;
    means for producing a reference voltage between a high level and a low level of said first logic signal, including two resistances with the reference voltage being taken at a point between the two resistances;
    means for connecting the producing means to the first power supply;
    means for providing a constant current which is connected to said first power supply;
    means for comparing said first logic signal with said reference voltage to produce a second logic signal which has higher levels than said first logic signal, said means for comparing being connected to said means for providing;
    an output terminal for outputting the second logic signal to a second logic circuit which produces a third logic signal which has higher levels than said first logic signal and is operated by a second power supply whose voltage level is higher than the voltage level of the first power supply; and
    means for connecting the comparing means to the second power supply.

4. An interface circuit according to claim 1, 2 or 3 wherein the comparing means includes a differential amplifier for comparing said first logic signal with said reference voltage to produce said second logic signal.

5. An interface circuit according to claim 3 wherein:
    the comparing means includes a comparator for comparing said first logic signal with said reference voltage and a linear amplifier comprising a first MOSFET whose gate is connected to the output terminal of said comparator and a second MOSFET whose channel type is a channel type different from that of said first MOSFET and which is connected to said first MOSFET in series for amplifying the output signal from said comparator and producing said second logic signal.

6. An interface circuit according to claim 1, 2 or 5 wherein:
    the comparing means includes a stabilizing circuit inserted between said comparator and said linear amplifier for making said linear amplifier operate stably.

* * * * *